United States Patent
Oda et al.

(10) Patent No.: US 12,412,864 B2
(45) Date of Patent: *Sep. 9, 2025

(54) BONDING WIRE FOR SEMICONDUCTOR DEVICES

(71) Applicants: NIPPON MICROMETAL CORPORATION, Iruma (JP); NIPPON STEEL CHEMICAL & MATERIAL CO., LTD., Tokyo (JP)

(72) Inventors: Daizo Oda, Saitama (JP); Takumi Ohkabe, Saitama (JP); Teruo Haibara, Saitama (JP); Takashi Yamada, Saitama (JP); Tetsuya Oyamada, Tokyo (JP); Tomohiro Uno, Tokyo (JP)

(73) Assignees: NIPPON MICROMETAL CORPORATION, Iruma (JP); NIPPON STEEL Chemical & Material Co., Ltd., Tokyo (JP)

(*) Notice: Subject to any disclaimer, the term of this patent is extended or adjusted under 35 U.S.C. 154(b) by 937 days.

This patent is subject to a terminal disclaimer.

(21) Appl. No.: 17/553,275

(22) Filed: Dec. 16, 2021

(65) Prior Publication Data

US 2022/0108971 A1  Apr. 7, 2022

Related U.S. Application Data

(63) Continuation of application No. 16/067,120, filed as application No. PCT/JP2016/078090 on Sep. 23, 2016, now Pat. No. 11,342,299.

(30) Foreign Application Priority Data

Apr. 28, 2016 (JP) .................. 2016-090613

(51) Int. Cl.
*C22C 5/06* (2006.01)
*C22C 5/10* (2006.01)
*H01L 23/00* (2006.01)

(52) U.S. Cl.
CPC .............. *H01L 24/45* (2013.01); *C22C 5/06* (2013.01); *C22C 5/10* (2013.01); *H01L 24/48* (2013.01); *H01L 2224/45005* (2013.01); *H01L 2224/45105* (2013.01); *H01L 2224/45109* (2013.01); *H01L 2224/45139* (2013.01); *H01L 2224/45144* (2013.01); *H01L 2224/45147* (2013.01); *H01L 2224/45155* (2013.01); *H01L 2224/45164* (2013.01); *H01L 2224/45169* (2013.01); *H01L 2224/45173* (2013.01); *H01L 2224/45186* (2013.01); *H01L 2224/45193* (2013.01); *H01L 2224/48465* (2013.01); *H01L 2224/48507* (2013.01); *H01L 2924/01004* (2013.01); *H01L 2924/01005* (2013.01); *H01L 2924/01015* (2013.01); *H01L 2924/0102* (2013.01); *H01L 2924/01039* (2013.01); *H01L 2924/01048* (2013.01); *H01L 2924/01057* (2013.01); *H01L 2924/01058* (2013.01)

(58) Field of Classification Search
CPC .. C22C 5/10; C22C 5/06; H01L 24/48; H01L 2224/45; H01L 24/45; C22F 1/14
See application file for complete search history.

(56) References Cited

U.S. PATENT DOCUMENTS

| | | | |
|---|---|---|---|
| 10,381,320 B2* | 8/2019 | Oyamada | H01L 24/43 |
| 2004/0014266 A1 | 1/2004 | Uno et al. | |
| 2008/0240975 A1* | 10/2008 | Cho | H01L 24/45 |
| | | | 420/501 |
| 2009/0072399 A1* | 3/2009 | Terashima | H01L 24/43 |
| | | | 257/E23.024 |
| 2012/0263624 A1 | 10/2012 | Chiba et al. | |
| 2014/0302317 A1 | 10/2014 | Antoku et al. | |
| 2017/0110430 A1 | 4/2017 | Oyamada et al. | |
| 2017/0365576 A1 | 12/2017 | Oyamada et al. | |

FOREIGN PATENT DOCUMENTS

| | | |
|---|---|---|
| CN | 105492637 A | 4/2016 |
| JP | S60-200930 A | 10/1985 |
| JP | H04-079241 A | 3/1992 |
| JP | H04-079243 A | 3/1992 |
| JP | H04-079245 A | 3/1992 |
| JP | H11-288962 A | 10/1999 |
| JP | 2001-176912 A | 6/2001 |
| JP | 2006-032934 A | 2/2006 |
| JP | 2008-198977 A | 8/2008 |
| JP | 2012-169374 A | 9/2012 |
| JP | 5839763 B1 | 1/2016 |
| TW | 201434052 A | 9/2014 |
| TW | 201602364 A | 1/2016 |
| WO | 02/023618 A1 | 3/2002 |

OTHER PUBLICATIONS

German Office Action issued in corresponding German Patent Application No. 11 2016 005 580.3, dated Apr. 18, 2019, with English Translation.
Chinese Office Action issued in corresponding Chinese Patent Application No. 201910879473.6, dated Mar. 2, 2020 with English Translation.
Search Report issued in corresponding International Patent Application No. PCT/JP2016/078090, dated Nov. 29, 2016.
Decision to Grant a Patent issued in corresponding Japanese Patent Application No. 2017-502733, dated Aug. 8, 2017.

(Continued)

*Primary Examiner* — Jessee R Roe
(74) *Attorney, Agent, or Firm* — Rimon P.C.

(57) ABSTRACT

Bonding wire for semiconductor devices contains one or more of Be, B, P, Ca, Y, La, and Ce in a total of 0.031 at % to obtain a 0.180 at %, further contains one or more of In, Ga, and Cd in a total of 0.05 at % to 5.00 at %, and has a balance of Ag and unavoidable impurities. Due to this, it is possible to obtain a bonding wire for semiconductor devices sufficiently forming an intermetallic compound layer at a ball bond interface to secure the bond strength of the ball bond, not causing neck damage even in a low loop, having a good leaning characteristic, and having a good FAB shape.

7 Claims, No Drawings

(56) References Cited

OTHER PUBLICATIONS

Notification of Reasons for Refusal issued in corresponding Japanese Patent Application No. 2017-502733, dated Jun. 13, 2017.
Notification of Reasons for Refusal issued in corresponding Japanese Patent Application No. 2017-502733, dated Apr. 18, 2017.
Taiwanese Office Action issued in corresponding Taiwanese Patent Application No. 107102564, dated Jul. 31, 2018, with English Translation.
Chinese Office Action issued in corresponding Chinese Patent Application No. 201910879473.6, dated Feb. 20, 2021, with English translation.
Non-Final Rejection issued in corresponding U.S. Appl. No. 16/067,120, dated Aug. 16, 2019.
Final Rejection issued in corresponding U.S. Appl. No. 16/067,120, dated Dec. 3, 2019.
Non-Final Rejection issued in corresponding U.S. Appl. No. 16/067,120, dated May 18, 2020.
Final Rejection issued in corresponding U.S. Appl. No. 16/067,120, dated Sep. 25, 2020.
Non-Final Rejection issued in corresponding U.S. Appl. No. 16/067,120, dated May 14, 2021.
Final Rejection issued in corresponding U.S. Appl. No. 16/067,120, dated Sep. 21, 2021.

* cited by examiner

BONDING WIRE FOR SEMICONDUCTOR DEVICES

CROSS REFERENCE

This application is a Continuation of U.S. application Ser. No. 16/067,120, which is the U.S. National Phase under 35 U.S.C. § 371 of International Application No. PCT/JP2016/078090, filed on Sep. 23, 2016, which claims the benefit of Japanese Application No. 2016-090613, filed on Apr. 28, 2016, the entire contents of each are hereby incorporated by reference.

TECHNICAL FIELD

The present invention relates to a bonding wire for semiconductor devices utilized for connecting an electrode on a semiconductor chip with an external lead or other interconnect of a circuit board.

BACKGROUND

At the present time, as a bonding wire for semiconductor devices bonding an electrode on a semiconductor chip with an external lead (below, sometimes referred to as a "bonding wire" or simply a "wire"), fine wire of a wire diameter of 15 to 50 μm or so has mainly been used. As the method of bonding a bonding wire, the thermosonic bonding method is most general. A universal bonding apparatus, a capillary alignment jig for connecting a bonding wire by passing it through it, etc. may be used. The bonding process of a bonding wire is as follows. First, the tip of the wire is heated to melt by arc heat input, a ball is formed by surface tension, then this ball part is compression bonded on an electrode on a semiconductor chip heated to 150 to 300° C. in range (below, referred to as "ball bonding"). Next, a loop is formed, then the wire part is compression bonded to an electrode at an external lead side (below, referred to as "wedge bonding"). For the part to which the bonding wire is bonded, that is, the electrode on the semiconductor chip, usually an electrode structure comprised of an alloy film mainly comprised of Al formed on an Si substrate or an electrode structure of an electrode on the external lead side plated with Ag, plated with Pd, etc. is used.

A bonding wire is required to have excellent ball formability, ball bondability, wedge bondability, loop formability, etc. As the material of the bonding wire enabling these performance demands to be comprehensively satisfied, Au has mainly been used. However, Au is expensive, so another type of metal with a cheaper material cost is desired. As a low cost wire material taking the place of Au, Cu (copper) has been studied. Compared with Au, Cu is easily oxidized, so in PTL 1, as a two-layer bonding wire of a core material and a coating layer (outer peripheral part), an example of use of Cu for the core material and Pd (palladium) for the coating layer is shown.

Cu wire or Pd-coated Cu wire is high in hardness after bonding, so a material with a lower hardness is demanded. As an element having an electrical conductivity equal to or better than Au and a hardness lower than even Cu and further having oxidation resistance, Ag (silver) may be mentioned.

However, a bonding wire using Ag (below, referred to as an "Ag bonding wire") had the problem of a low bond reliability or stability of a loop in high density mounting. The bond reliability is evaluated for the purpose of evaluating the bond life in the actual environment of use of a semiconductor device. In general, for evaluation of the bond reliability, a high temperature standing test or high temperature, high humidity test is used. An Ag bonding wire, compared with a bonding wire using Au (below, referred to as an "Au bonding wire"), had the problem of an inferior life of a ball bond in a high temperature, high humidity test. In high density mounting, small ball bonding is performed, so the area contributing to the bonding becomes smaller, so securing the life of the bond becomes even more difficult.

PTL 2 discloses an Ag—Au—Pd ternary alloy-based bonding wire mainly comprised of Ag. This bonding wire is heat treated for annealing before being continuously drawn by a die, is heat treated for thermal refining after being continuously drawn by a die, and is bonded by ball bonding in a nitrogen atmosphere. Due to this, even if used in a harsh usage environment of a high temperature, high humidity, and high pressure, it is considered possible to maintain connection reliability with aluminum pads.

For the high temperature, high humidity test, a test performed under conditions of a temperature of 121° C. and a relative humidity of 100%, called a PCT (pressure cooker test), is generally used. In recent years, as a more stringent method of evaluation, a test performed under conditions of a temperature of 130° C. and a relative humidity of 85%, called a HAST (highly accelerated temperature and humidity stress test), is often used. In a semiconductor device for high density mounting, when envisioning the operating environment, normal operation is sought even after 300 hours or more have elapsed in an HAST. Ag bonding wire has had a problem with the life of the ball bond in the HAST. Ag bonding wire peels off at the ball bond due to exposure to a high temperature, high humidity environment whereby the electrical connection is lost and breakdown of the semiconductor device is caused.

PTL 3 discloses a bonding wire for semiconductor devices containing one or more of In, Ga, and Cd in a total of 0.05 to 5 at % and having a balance of Ag and unavoidable impurities. Due to this, it is possible to improve the bond reliability as demanded for high density mounting.

CITATION LIST

Patent Literature

PTL 1: WO2002-23618A
PTL 2: Japanese Patent Publication No. 2012-169374A
PTL 3: Japanese Patent No. 5839763

SUMMARY OF INVENTION

Technical Problem

Narrower pitch designs reducing the distances between adjacent bonding wires have been increasingly utilized. As demands on bonding wire corresponding to this, increased fineness, higher strength, loop control, and improvement of the bondability etc. have been sought. Due to the higher densities of semiconductor mounting, loop shapes are becoming more complicated. In the classification of loop shapes, the loop height and bonding wire length (span) have become indicators. In the latest semiconductors, cases of high loops and low loops, short spans and long spans, and other contradictory loop formation inside a single package have been increasing.

In high density mounting, to cope with the narrower pitches, balls smaller than usual have often been formed for bonding (small ball bonding). Bonding wire requires a sufficient, stable bond strength of a ball bond even in the case of small ball bonding. Further, for ball bonding, it is also required that the FAB (free air ball) shape formed at the tip of the bonding wire be excellent.

Due to the greater number of pins and narrower pitch, wire connections differing in wire length and loop height have been mixed in single semiconductor devices. If forming a low loop with a low loop height, neck damage of the bond more easily occurs. Further, if narrowing the pitch, sometimes leaning failures occur at the ball upright parts. A "leaning failure" is the phenomenon of the wire upright part near the ball bond leaning and the distance from the adjacent wire becoming closer. A wire material improved in low loop characteristic and leaning characteristic has been sought.

The present invention has as its object the provision of a bonding wire for semiconductor devices mainly comprised of Ag, in which bonding wire for semiconductor devices, the bond reliability demanded for high density mounting is secured and simultaneously a sufficient, stable bond strength is realized at a ball bond, no neck damage occurs even in a low loop, the leaning characteristic is excellent, and the FAB shape is excellent.

Solution to Problem

That is, the gist of the present invention is as follows:
(1) Bonding wire for semiconductor devices containing one or more of Be, B, P, Ca, Y, La, and Ce in a total of 0.031 at % to 0.180 at %, further containing one or more of In, Ga, and Cd in a total of 0.05 at % to 5.00 at %, and having a balance of Ag and unavoidable impurities.
(2) The bonding wire for semiconductor devices according to (1) further containing one or more of Ni, Cu, Rh, Pd, Pt, and Au in a total of 0.01 at % to 5.00 at %. Here, the Ni, Cu, Rh, Pd, Pt, and Au are included instead of part of the above Ag.
(3) The bonding wire for semiconductor devices according to (1) or (2) wherein when defining the ratio of the total of the number of atoms of In, Ga, and Cd with respect to the number of atoms of the metal elements as the second element atomic ratio, the second element atomic ratio at a region of 0 to 1 nm from the wire surface in the depth direction (wire surface layer part) is 1.1 times or more the second element atomic ratio at a region of 1 nm to 10 nm from the wire surface in the depth direction (wire surface layer bottom part).
(4) The bonding wire for semiconductor devices according to any one of (1) to (3) wherein when defining the ratio of the total of the number of atoms of In, Ga, and Cd with respect to the number of atoms of the metal elements as the second element atomic ratio, the second element atomic ratio at a region of 0 to 10 nm from the wire surface in the depth direction (wire surface part) is 2 times or more the second element atomic ratio at a region of 20 nm to 30 nm from the wire surface in the depth direction (wire inside part).
(5) The bonding wire for semiconductor devices according to any one of (1) to (4) wherein an average crystal grain size in the cross-section vertical to the wire axis is 0.2 µm to 3.5 µm.
(6) The bonding wire for semiconductor devices according to any one of (1) to (5), wherein when measuring the crystal direction in the wire axial direction at the cross-section parallel to the wire axis, including the wire axis, of the bonding wire, the abundance ratio of the <100> crystal direction where the angular difference with respect to the wire axial direction of the bonding wire is 15 degrees or less is, by area ratio, 30% to 100%.
(7) The bonding wire for semiconductor devices according to any one of (1) to (6) containing one or more of In, Ga, and Cd in a total of 2.00 at % or less.

Advantageous Effects of Invention

The Ag bonding wire for semiconductor devices of the present invention contains one or more of Be, B, P, Ca, Y, La, and Ce in a total of 0.031 at % to 0.180 at % and further containing one or more of In, Ga, and Cd in a total of 0.05 at % to 5.00 at % whereby an intermetallic compound layer is sufficiently formed at the ball bond interface and the bond strength of the ball bond can be secured. Furthermore, it is possible to obtain a bonding wire for semiconductor devices where no neck damage occurs in a low loop as well, the leaning characteristic is excellent, and the FAB shape is excellent.

DESCRIPTION OF EMBODIMENTS

The present invention provides a bonding wire for semiconductor devices containing one or more of Be, B, P, Ca, Y, La, and Ce (below, also referred to as the "first group of elements") in a total of 0.031 at % to 0.180 at %, further containing one or more of In, Ga, and Cd (below, also referred to as the "second group of elements") in a total of 0.05 at % to 5.00 at %, and having a balance of Ag and unavoidable impurities. Note that, in the Description, the content of the components (%) shows the at % unless particularly indicated otherwise.

First Group of Elements (Be, B, P, Ca, Y, La, Ce)

When bonding an Ag bonding wire to an Al electrode by ball bonding, an Ag—Al intermetallic compound is formed at the bond interface of the aluminum electrode and ball part (below, referred to as the "ball bond interface"). In the present invention, to realize sufficient, stable bond strength of a ball bond, it is necessary that a stable intermetallic compound layer be formed at the ball bond interface. However, in the case of use of a conventional Ag bonding wire, an insufficient intermetallic compound layer is formed at the ball bond interface.

Therefore, it was found that by including one or more of Be, B, P, Ca, Y, La, and Ce (first group of elements) in the bonding wire in a total of 0.031 at % or more, it is possible to make the coverage rate of the ball bond interface by the intermetallic compound over 90%. As a result, a sufficient, stable bond strength of the ball bond is obtained. By including the first group of elements in a range of 0.031 at % to 0.180 at %, it is believed that when bonding an Ag bonding wire to an Al electrode by ball bonding, the affinity between the Ag and Al at the time of the initial bonding increases and formation of an Ag—Al intermetallic compound at the ball bond interface is promoted.

When including the elements of the first group of elements in less than 0.031 at %, an Ag—Al intermetallic compound is not sufficiently formed and a sufficient ball bond strength cannot be obtained. On the other hand, if the elements of the first group of elements are contained in over 0.180 at %, the FAB shape deteriorates.

The lower limit of the content of the elements of the first group of elements should be preferably 0.060 at %, more preferably 0.090 at %. The upper limit of the content of elements of the first group of elements should be preferably 0.180 at %, more preferably 0.170 at %.

In wire bonding of a semiconductor device, if performing low loop bonding with a low loop height, the neck part is easily damaged. As a result, sometimes the pull strength fell. By including the elements of the first group of elements in a range of 0.031 at % to 0.180 at %, even in low loop bonding, it is possible to prevent damage to the neck part and possible to stably perform low loop bonding. It is believed that the crystals at the heat affected zone (HAZ) near the ball part at a bonding wire become finer and thereby damage of the neck part in low loop bonding is reduced.

Further, if narrowing the pitch in wire bonding, leaning failures of the ball upright parts sometimes occur. In particular, Ag bonding wire is low in hardness, so leaning failures easily occur. By including the elements of the first group of elements in a range of 0.031 at % to 0.180 at %, it becomes possible to prevent the occurrence of leaning failures even in the case of narrowing the pitch. It is believed that by including the first group of elements in the Ag bonding wire, the breaking strength of the wire increases and thereby the leaning failures are reduced.

Furthermore, by including the elements of the first group of elements in a range of 0.031 at % to 0.180 at %, it is also possible to improve the FAB shape and reduce the off-centeredness of the FAB or the ratio of occurrence of an irregular FAB.

Second Group of Elements (In, Ga, Cd)

When bonding an Ag bonding wire to an Al electrode by ball bonding and performing a high temperature, high humidity test (HAST test) under conditions of a temperature of 130° C. and a relative humidity of 85%, the time until the shear strength of the ball bond becomes ⅓ of the initial shear strength is evaluated as the ball bond life. In a conventional Ag bonding wire not containing In, Ga, and Cd, only a less than 150 hour ball bond life can be obtained. As opposed to this, the inventors discovered that by including one or more of In, Ga, and Cd (second group of elements) in a total of 0.05 at % or more, it is possible to obtain a 300 hour or more ball bond life in the same HAST test.

On the other hand, if including elements of the second group of elements in a total of over 5.00 at %, stress concentrates and chip damage more easily occurs at the time of ball bonding in the bonding step. For this reason, one or more of In, Ga, and Cd (second group of elements) may be made a total of 5.00 at % or less.

The lower limit of the content of elements of the second group of elements should be made preferably 0.10 at %, more preferably 0.50 at %. The upper limit of the content of elements of the second group of elements should be made preferably 3.00 at %, more preferably 2.00 at %.

Third Group of Elements (Ni, Cu, Rh, Pd, Pt, Au)

The inventors further discovered that by including one or more of Ni, Cu, Rh, Pd, Pt, and Au (below, also referred to as a "third group of elements") in a total of 0.01 at % to 5.00 at %, it is possible to further improve the service life of the bonding wire. Compositely adding a third group of elements comprised of elements with a strong bonding strength with at least one element of In, Ga, and Cd (second group of elements) is effective in preventing deterioration along with time.

A conventional bonding wire sometimes fell in ball formability and other aspects of performance along with time due to the adsorption of sulfur atoms at its surface. To suppress the adsorption of sulfur atoms at the bonding wire surface (that is, to improve the sulfidation resistance), the technique of lowering the activity of the bonding wire surface is effective. For example, it is sufficient to replace the Ag atoms at the bonding wire surface with elements lower in adsorption ability with sulfur compared with Ag. At the surface of the Ag bonding wire according to the present invention, there are In, Ga, and Cd (second group of elements) present, so by adding elements with strong bonding strength with these elements, it is possible to more efficiently improve the sulfidation resistance.

That is, the Ag bonding wire of the present invention improves the sulfidation resistance by inclusion of one or more of Ni, Cu, Rh, Pd, Pt, and Au (third group of elements) and can improve the service life of the bonding wire. If the content of elements of the third group of elements is less than 0.01 at %, the above advantageous effect cannot be expected. If the content of elements of the third group of elements is over 5.00 at %, the heat input due to the arc discharge to the wire surface becomes unstable and a ball with a high sphericity can no longer be obtained, so this is not suitable for practical use. Preferably, if the content of elements of the third group of elements is 0.5 at % to 3.00 at %, a higher effect is obtained. This is because it is possible to suppress more variations in heat input due to arc discharge.

For analysis of the content of elements contained in the bonding wire, it is possible to utilize an ICP emission spectroscopic analyzer etc. If oxygen or carbon or another element is adsorbed at the surface of the bonding wire, before analysis, it is also possible to shave off a region of 2 nm from the surface by sputtering etc. and then measure the content. Alternatively, it is possible to measure the content after pickling the wire surface.

Improvement of Wedge Bondability by Gradient of Concentration of Alloy at Wire Surface In the Ag bonding wire of the present invention, the second element atomic ratio of the ratio of the total of the number of atoms of In, Ga, and Cd (second group of elements) of the bonding wire surface part (region of 0 to 10 nm from surface of bonding wire in depth direction) with respect to the total of the number of atoms of the metal elements in that region is preferably at least 2 times the second element atomic ratio inside the bonding wire (region of 20 nm to 30 nm from bonding wire surface in depth direction). Due to this, it is possible to improve the wedge bondability. The upper limit of the ratio of the second element atomic ratios at the surface part and inside of the bonding wire is not particularly limited, but even if 4, there is no problem. That is, the "second element atomic ratio" is defined as the ratio of the total of the number of atoms of In, Ga, and Cd (second group of elements) with respect to the total of the number of atoms of the metal elements in a certain region.

Second element atomic ratio=(Total of number of atoms of In, Ga, and Cd)/(Total of number of atoms of metal elements)

The content in the radial direction from the bonding wire surface toward the center axis of the wire (wire axis) (below, referred to as the "depth direction") can be analyzed using an Auger electron spectroscopy apparatus. First, while shaving away the surface of the bonding wire by sputtering etc., the content is measured to obtain a content profile in the depth direction. The elements for which the content profiles are acquired may for example be made Ag and the elements added in the first to third groups of elements. The wire is divided into a region of 0 to 10 nm and a region of 20 to 30 nm from the wire surface in the depth direction (below, referred to as "depth of 0 to 10 nm", "depth of 20 to 30 nm", etc.), the average concentrations of the respective elements in the regions are found, and these are used as the concentrations of the respective elements in the regions.

In wedge bonding, the bonding wire is deformed to secure the bond area, so the softer the surface part of the bonding wire, the easier it becomes to secure the bond area and therefore the higher bond strength is obtained. Therefore, the technique of increasing the concentration of elements softer than Ag at the surface part of the bonding wire compared with the inside of the bonding wire is effective. Here, the "inside of the bonding wire" will be explained below as the region of a depth of 20 nm to 30 nm from the wire surface (wire inside), while the "surface part of the bonding wire" will be explained as the region of a depth of 0 to 10 nm from the wire surface (wire surface part).

If the second element atomic ratio of the bonding wire surface part is 2 times or more of the second element atomic ratio of the bonding wire inside, a high bond strength is obtained at the wedge bond. That is, if making the second element atomic ratio of the depth of 0 to 10 nm $X_{0-10\ nm}$ and making the second element atomic ratio of the depth of 20 to 30 nm $X_{20-30\ nm}$, if $X_{0-10\ nm}/X_{20-30\ nm} \geq 2$ stands, a high bond strength is obtained at the wedge bond. If $X_{0-10\ nm}/X_{20-30\ nm} < 2$, the above effect cannot be expected.

Method of Production of Bonding Wire

The method of production of the bonding wire will be explained. The bonding wire is produced by continuous drawing etc. using a die. At this time, 200° C. to 500° C. intermediate heat treatment and drawing are repeatedly performed to work the wire until reaching the final wire diameter. Here, by repeating the 200° C. to 500° C. intermediate heat treatment three or more times, it is possible to make the second element atomic ratio of the wire surface part two times or more higher than the second element atomic ratio of the wire inside. Preferably, the intermediate heat treatment temperature is 200° C. to 330° C. the first time, 250° C. to 400° C. the second time, and 350° C. to 500° C. the third time and on. Doing this is more effective. This is because the above heat treatment enables the added elements to be diffused from the surface of the bonding wire.

Improvement of Feed-Out of Wire by Improvement of Wire Crystal Grain Size

The Ag bonding wire of the present invention preferably further has an average crystal grain size at a cross-section vertical to the wire axis of 0.2 μm to 3.5 μm. Due to this, the feed-out of the wire can be improved. Here, the "wire axis" means the axis passing through the cross-sectional center of the bonding wire and parallel to the longitudinal direction (also referred to as the "wire center axis").

For the method of exposing the wire cross-section, for example, mechanical polishing, ion etching, etc. may be utilized. For the method for finding the average crystal grain size, for example, the electron backscattered diffraction (EBSD) method can be used. The EBSD method can find the difference in crystal directions between adjoining measurement points so as to judge crystal grain boundaries. A crystal grain boundary with a difference in direction of 15 degrees or more was defined as a large angle grain boundary. A region surrounded by large angle grain boundaries was defined as one crystal grain. The crystal grain size was defined as the diameter obtained by using dedicated analysis software (for example, OIM analysis made by TSL Solutions etc.) to calculate the area of a crystal grain and assuming that area to be a circle.

When bonding a bonding wire, the bonding wire is fed out a little amount at a time from a state wound around a columnar jig called a "spool". When feeding it out, a tensile force acts on the bonding wire in the wire axial direction, so the bonding wire is liable to end up deforming and the wire diameter to end up becoming finer. To prevent such a phenomenon, it is necessary to secure strength against the shear stress acting in the direction vertical to the wire axis. As the method for securing strength against the shear stress, it is effective to reduce the crystal grain size in the cross-section vertical to the wire axis.

In the present invention, a high feed-out performance is obtained by the average crystal grain size in the cross-section vertical to the wire axis of the bonding wire being 0.2 μm to 3.5 μm. If the average crystal grain size is over 3.5 μm, the wire ends up locally deforming due to the tensile stress, so the above effect cannot be obtained. If the average crystal grain size is less than 0.2 μm, the bonding wire ends up becoming harder than necessary, so the wear at the contact part with the capillary becomes greater, so this is not suitable for practical use. Preferably, if the average crystal grain size is 0.4 μm to 3.0 μm, a higher effect is obtained. 0.5 μm to 2.5 μm is further preferable.

As explained above, when using a die to continuously draw a wire etc., 200° C. to 500° C. intermediate heat treatment and drawing are repeated until the final wire diameter. Here, by making the wire diameter for performing intermediate heat treatment ϕ50 μm to ϕ100 μm, the average crystal grain size at the cross-section in the direction vertical to the wire axis can be controlled to 0.2 μm to 3.5 μm. This is due to the effect of being able to control the crystal grain growth at the time of recrystallization.

Wire Axial Direction Crystal Direction and Improvement of Wedge Bondability

In the measurement results when measuring the crystal direction of the cross-section parallel to the wire axis, including the wire axis, of the bonding wire (wire center cross-section), the abundance ratio of <100> crystal directions with an angular difference of 15 degrees or less with respect to the wire axial direction of the bonding wire (below, referred to as the "<100> abundance ratio") is preferably, by area ratio, 30% to 100%. Due to this, the wedge bondability can be further improved.

Regarding the wedge bondability, at the wire center cross-section of the bonding wire, the <100> abundance ratio can be made to increase so that deformation of the bond is promoted and a high bond strength is obtained. To obtain this effect, the <100> abundance ratio should be 30% or more. If the <100> abundance ratio is less than 30%, the deformation of the bond becomes insufficient and a high bond strength cannot be obtained at the wedge bond.

As the method of exposing the cross-section of the bonding wire, mechanical polishing, ion etching, etc. may be utilized. The crystal direction of the cross-section of the bonding wire can be determined using the EBSD method. The <100> abundance ratio can be found by calculating the ratio of the regions having <100> crystal directions with angular differences of 15 degrees or less from the wire axial direction of the bonding wire to the area of the measurement region of the crystal directions using EBSD etc. The measurement region should be a length in the wire axial direction of 100 μm at the wire center cross-section.

When using a die to continuously draw wire, intermediate heat treatment and drawing are repeatedly performed until reaching the final wire diameter. Here, the wire feed speed at the time of drawing may be made 200 m/min to 300 m/min and the temperature of the intermediate heat treatment may be made 200° C. to 300° C. so as to increase the <100> abundance ratio to 30% or more. Note that, this technique is also effective if performing the intermediate heat treatment a plurality of times.

Gradient of Concentration of Alloy at Wire Surface and Improvement of Capillary Service Life The friction at the time of feeding out the bonding wire causes wear at the inside of the capillary. As opposed to this, it is possible to control the composition of the surface of the bonding wire and reduce the strength of the surface of the bonding wire so as to reduce the frictional force between the capillary and the bonding wire and improve the service life of the capillary. To reduce the strength of the wire surface, it is sufficient to increase the content of at least one element among In, Ga, and Cd at the wire surface.

That is, the second element atomic ratio at the wire surface layer part (region of depth of 0 to 1 nm from surface of bonding wire) should be 1.1 times or more of the second element atomic ratio at the wire surface layer bottom part (region of depth of 1 nm to 10 nm from surface of bonding wire). Due to this, the service life of the capillary can be improved. The upper limit of the ratio of the second element atomic ratio at the bonding wire surface layer part and surface layer bottom part is not particularly limited, but is not a problem even if 2 times.

That is, if making the second element atomic ratio of the wire surface layer part $X_{0-1\ nm}$ and making the second element atomic ratio of the wire surface layer bottom part $X_{1-10\ nm}$, if $X_{0-1\ nm}/X_{1-10\ nm} \geq 1.1$, an excellent service life of the capillary is obtained. If $X_{0-1\ nm}/X_{1-10\ nm} < 1.1$, the above effect cannot be expected.

The drawn wire is treated by final heat treatment so that the final elongation at break becomes a predetermined value. Here, by performing additional heat treatment at 350° C. to 500° C. for 0.2 second to 0.5 second after final heat treatment, the ratio of the second element atomic ratio of the wire surface layer part to the second element atomic ratio at the wire surface layer bottom part may be made 1.1 or more.

EXAMPLES

Below, examples will be explained in detail. The Ag material used was one with a purity of 99.9 at % or more and a balance of unavoidable impurities. The Be, B, P, Ca, Y, La, Ce, Ni, Cu, Rh, Pd, Pt, Au, In, Ga, and Cd used were ones with a purity of 99.9 at % or more and a balance of unavoidable impurities.

Ag bonding wires having the chemical compositions shown in Table 1-1 and Table 1-2 were produced. The Ag alloy used for each bonding wire was loaded into a carbon crucible worked to a columnar shape of a diameter of $\phi$3 mm to $\phi$6 mm. A high frequency furnace was used to heat and melt it in a vacuum or $N_2$, Ar gas, or other inert atmosphere at 1080° C. to 1600° C. After that, it was furnace cooled or air cooled.

The obtained Ag alloy was drawn to work it to $\phi$0.9 mm to $\phi$1.2 mm, then continuously drawn using a die etc. to fabricate a $\phi$300 μm to $\phi$600 μm wire. At this time, when oxygen or sulfur is adsorbed at the wire surface, the wire is pickled by hydrochloric acid etc. After that, 200° C. to 500° C. intermediate heat treatment and drawing were repeated to work the wire to a final wire diameter of $\phi$15 μm to $\phi$25 μm. The drawing was performed using a commercially available lubricating fluid. The wire feed rate at the time of drawing was 20 m/min to 300 m/min. The intermediate heat treatment was performed by running the wire continuously through an Ar gas atmosphere. The feed rate of wire at the time of the intermediate heat treatment was made 20 m/min to 200 m/min.

Here, the number of times of 200° C. to 500° C. intermediate heat treatment was changed to adjust the ratio ($X_{0-10\ nm}/X_{20-30\ nm}$) of the second element atomic ratio in the region of 0 to 10 nm to the second element atomic ratio at a depth of 20 to 30 nm from the wire surface. The more the number of times of intermediate heat treatment is increased, the higher the $X_{0-10\ nm}/X_{20-30\ nm}$ can be made. As preferable conditions, the intermediate heat treatment temperature was made 200° C. to 330° C. the first time, 250° C. to 400° C. the second time, and 350° C. to 500° C. in range the third time and on. Due to these heat treatments, the added elements diffused into the surface of the bonding wire.

Further, the wire diameter when performing the intermediate heat treatment was changed to adjust the average grain size of the wire. As preferable conditions, by making the wire diameter when performing the intermediate heat treatment $\phi$50 μm to $\phi$100 μm or more, the average crystal grain size at the cross-section in the direction vertical to the wire axis was made 0.2 μm to 3.5 μm. This is due to the effect of the ability to control the crystal grain growth at the time of recrystallization.

Furthermore, the wire feed rate at the time of drawing and the temperature of the intermediate heat treatment were adjusted to adjust the <100> abundance ratio. As preferable conditions, the wire feed rate at the time of drawing was made 200 to 300 m/min and the temperature of the intermediate heat treatment was made 200 to 300° C. to increase the <100> abundance ratio to 30% or more. Note that, this art is effective in the case of performing the intermediate heat treatment several times.

The drawn wire was treated by final heat treatment to give a final elongation at break of 9 to 15%. The final heat treatment was performed by a method similar to intermediate heat treatment. The feed rate of the wire at the time of final heat treatment was made 20 m/min to 200 m/min in the same way as the intermediate heat treatment. The final heat treatment temperature was made 200° C. to 600° C. and the heat treatment time was made 0.2 second to 1.0 second. Here, in some of the examples, after the final heat treatment, additional heat treatment was performed at 350° C. to 500° C. for 0.2 second to 0.5 second to control the ratio ($X_{0-1\ nm}/X_{1-10\ nm}$) of the second element atomic ratio at the depth of 0 to 1 nm (wire surface layer part) to the second element atomic ratio at the depth of 1 to 10 nm from the wire surface (wire surface layer bottom part) to 1.1 times or more.

The concentrations of elements contained in the bonding wire were analyzed by an ICP emission spectroscopic analyzer. When oxygen, carbon, or another element was adsorbed at the surface of the bonding wire, before the analysis, a region of 2 nm from the surface was shaved off by sputtering etc. then the concentrations were measured.

The concentrations in the depth direction from the bonding wire surface were analyzed by an Auger electron spectroscopy apparatus. First, the surface of the bonding wire was shaved off by sputtering etc. while measuring the concentration to obtain a profile of concentration in the depth direction. For example, the elements covered by the acquisition of the concentration profile may be made Ag and elements added in the first to third groups of elements. The contents of the elements were determined for the regions of the region of a depth of 0 to 1 nm from the wire surface (wire surface layer part), region of 1 nm to 10 nm (wire surface layer bottom part), region of 0 to 10 nm (wire surface part), and region of 20 nm to 30 nm (wire inside). When evaluating the regions including the wire surface (in this case, the region of a depth of 0 to 10 nm from the wire surface and the region of a depth of 20 to 30 nm from the wire surface) by an Auger electron spectroscopy apparatus, the carbon and other nonmetallic elements deposited on the wire surface are also analyzed. For this reason, if calculating the contents of alloy elements using all analyzed elements as the denominator, near the surface of the wire, they are evaluated as values smaller than the contents of the alloy elements contained in the wire. Here, in evaluating the contents of alloy elements near the surface including the wire surface (below, referred to as "near the surface"), the total of only the metal elements analyzed were used as the denominator. The nonmetallic elements were excluded from the denominator. Due to this, it is possible to evaluate the contents of alloy elements near the wire surface without error.

Further, making the second element atomic ratio of In, Ga, and Cd with respect to the total number of atoms of metal elements in the wire surface part $X_{0\text{-}10\ nm}$ and making the second element atomic ratio inside the wire $X_{20\text{-}30\ nm}$, the ratio $X_{0\text{-}10\ nm}/X_{20\text{-}30\ nm}$ was shown as the "Surface Layer Composition Ratio 1" in Table 2-1 and Table 2-2. Further, making the second element atomic ratio of at least one element selected from In, Ga, and Cd with respect to the total number of atoms of metal elements in the wire surface layer part $X_{0\text{-}1\ nm}$ and making the second element atomic ratio at the wire surface layer bottom part $X_{1\text{-}10\ nm}$, the ratio $X_{0\text{-}1\ nm}/X_{1\text{-}10\ nm}$ was shown as the "Surface Layer Composition Ratio 2" in Table 2-1 and Table 2-2.

In the evaluation of the average crystal grain size at the cross-section in the vertical direction to the wire axis, the wire cross-section was exposed by mechanical polishing. Using EBSD, the difference in crystal directions between adjoining measurement points is found. The grain boundaries with differences in directions of 15 degrees or more were defined as large angle grain boundaries while a region surrounded by large angle grain boundaries was defined as one crystal grain. The crystal grain size was shown in Table 2-1 and Table 2-2 in the "Average crystal grain size" column as the diameter when using dedicated analysis software to calculate the area and assuming that area as a circle.

In the evaluation of the crystal direction in the cross-section parallel to the wire axis, as the method of exposing the cross-section of the bonding wire, mechanical polishing was used. The crystal direction of the cross-section of the bonding wire was evaluated using the EBSD method. The <100> abundance ratio is found by calculating the ratio of the regions having <100> crystal directions with an angular difference with respect to the wire axial direction of the bonding wire of 15 degrees or less to the area of a measurement region of the crystal directions using EBSD and is shown in Table 2-1 and Table 2-2 in the "Crystal direction ratio" column. The measurement region was made a cross-section parallel to the wire axis, including the wire axis, with a long direction of 100 μm or less in the wire axial direction and with a short direction of the wire as a whole (approximately same length as wire diameter).

The sample for various evaluations of the ball bond was prepared by forming a ball bond by a commercially available wire bonder on an electrode obtained by forming an Al film of a thickness of 1.0 μm on an Si substrate on a general metal frame. The ball was formed while running an $N_2$+5% $H_2$ gas by a flow rate of 0.4 liter/min to 0.6 liter/min. The ball diameter was made a range of 1.5 times to 1.6 times the wire diameter.

The method of evaluation of an Ag—Al intermetallic compound layer at the ball bond interface when performing ball bonding (bond interface between Al electrode and ball part) will be explained. The intermetallic compound layer formed at the ball bond interface is extremely thin in layer thickness, so as is, examination is difficult even with a microscope. Therefore, in the evaluation employed by the present invention, the ball bonded sample was heat treated at 180° C. for 4 hours. Due to this heat treatment, at the ball bond interface, the intermetallic compound further grows at the part where the intermetallic compound layer is formed and can be evaluated by an optical microscope. On the other hand, at the ball bond interface, even if heat treating the part where the intermetallic compound layer is not formed at the time of bonding, no intermetallic compound will be newly formed. Therefore, even if performing heat treatment at 180° C. for 4 hours, the range of the intermetallic compound layer will not change but will become easier to examine, so will be able to be reliably evaluated. For the evaluation, after heat treatment, the bonding wire and ball part are dissolved in acid to expose the ball bond interface, the Ag—Al intermetallic compound at the exposed ball bond interface is examined by an optical microscope, and image analysis is used to find the intermetallic compound forming area ratio. Here, the "intermetallic compound forming area ratio" is the ratio of the area of the intermetallic compound layer to the entire area of the ball bond interface (%). If intermetallic compound forming area ratio is 80% or less, the formability is evaluated as "P" (poor), if over 80% to 90%, it is evaluated as "F" (fair), if over 90% to 95%, it is evaluated as "G" (good), and if over 95%, it is evaluated as "E" (excellent). G and E are passing. The results are shown in Table 2-1 and Table 2-2 in the "Intermetallic compound layer formability" column.

For the low loop characteristic, 100 wires were bonded to an evaluation use lead frame by loop lengths of 1 mm and loop heights of 60 μm. Next, the presence of any neck damage of a ball bond was evaluated by an SEM (scanning electron microscope). If the neck part of the ball bond cracks or the neck part deforms and the wire becomes thinner, it is judged that neck damage has occurred. If three or more neck parts have damage among 100 parts, the characteristic is evaluated as "P" (poor), if two, it is evaluated as "F" (fair), if one, it is evaluated as "G" (good), and if 0, it is evaluated as "E" (excellent). G and E are passing. The results are shown in Table 2-1 and Table 2-2 in the "Low loop characteristic" columns.

Regarding the evaluation of the leaning characteristic, 100 wires were bonded to an evaluation use lead frame by loop lengths of 5 mm and loop heights of 0.5 mm. The upright part of the wire was examined from the chip horizontal direction, then the distance (leaning distance) when the vertical line passing through the center of the ball bond and the upright part of the wire was maximum was used for evaluation. When the leaning distance was smaller than the wire diameter, the leaning characteristic was evaluated as good, while when it was larger, the upright part was slanted, so it was judged that the leaning characteristic was poor. The 100 bonded wires were examined under an optical microscope and the number of leaning failures was counted. Zero failures was evaluated as "E" (excellent), one to three was evaluated as "G" (good), four to five was evaluated as "F" (fair), and six or more was evaluated as "P" (poor). G and E are passing. The results are shown in Table 2-1 and Table 2-2 in the "Leaning characteristic" columns.

Regarding the FAB shape, a commercially available wire bonder was used to form a ball (FAB) for ball bonding at the bonding wire and examining the FAB shape using an SEM in that state. A total of 100 FABs were formed and evaluated. Spherical shapes were evaluated as good and off-centered or irregular shapes were evaluated as poor. Zero failures was evaluated as "E" (excellent), one to five was evaluated as "G" (good), six to 10 was evaluated as "F" (fair), and 11 or more was evaluated as "P" (poor). G and E are passing. The results are shown in Table 2-1 and Table 2-2 in the "FAB shape" columns.

A sample for evaluation of the bond reliability was fabricated by performing the above ball bonding, then using a commercially available epoxy resin to seal it. The bond reliability in a high temperature, high humidity environment was judged by the bond life of a ball bond when using an unsaturated type pressure cooker tester and exposing the sample to a high temperature, high humidity environment of a temperature of 130° C. and a relative humidity of 85%. The bond life of the ball bond was made the time when a shear test of a ball bond was performed every 100 hours and the value of the shear strength became one-third of the initially obtained shear strength. The shear test after a high temperature, high humidity test was performed by acid treatment to remove the resin and expose the ball bond. The shear test was performed using a DAGE microstrength tester. The value of the shear strength used was the average value of measurement values of 10 locations of ball bonds selected at random. In the above evaluation, if the bond life is less than 300 hours, it was judged there was a problem in practical use and the life was indicated as "P" (poor), if 300 to less than 500 hours, it was judged that there was no problem in practical use and the life was indicated as "F" (fair), if 500 hours or more, it was judged the life was particularly good and was indicated as "G" (good), and if 1000 hours or more, the life was indicated as "E" (excellent). The results are shown in Table 2-1 and Table 2-2 in the "HAST" columns.

The chip damage performance was evaluated by examining the Si substrate directly under a ball bond in the above ball bonded sample by an optical microscope. When cracks were seen in the Si substrate, the sample was judged poor. 100 locations were examined. If there was a failure in one location or more, it was judged there was a problem in practice and the performance was indicated as "P" (poor), while if no failure occurred at all, it was judged the performance was particularly excellent and was indicated as "G" (good). The results are shown in Table 2-1 and Table 2-2 in the "Chip damage" columns.

The service life of a bonding wire was evaluated by allowing the bonding wire to stand in an air atmosphere for a certain time period, then bonding it and evaluating if a good ball could be formed or if a good bond state could be obtained at the ball bond and wedge bond. For judgment of the ball formation, 100 balls were examined under an optical microscope. If there were five or more balls with low sphericity or balls with uneven surfaces, the formability was judged poor. The balls are formed under conditions of $N_2$+5% $H_2$ gas and a gas flow rate of 0.4 to 0.6 liter/min. The diameter of the balls was made a range of 1.5 to 1.6 times the wire diameter. Whether or not a good bond state was obtained in the ball bond and wedge bond was judged by using a commercially available wire bonder to continuously bond 1000 wires. The ball bonds and the wedge bonds were examined by an optical microscope. If there are three or more peeled off wires or other failures, the service life was judged as poor. If any of the above failures occurred in a standing time period of less than 12 months, it was judged that there was a problem in practice and the service life was indicated as "P" (poor), if failures occurred in a standing time period after the elapse of 12 months to less than 18 months, it was judged that there was no problem in practical use and the service life was indicated as "F" (fair), if failures occurred in a standing time period after the elapse of 18 months to less than 24 months, the service life was judged to be good and was indicated as "G" (good), and if no failures at all occurred in a standing time period even after the elapse of 24 months, the service life was judged to be particularly good and was indicated as "E" (excellent). The results are shown in Table 2-1 and Table 2-2 in the "Service life" columns.

The wedge bondability was evaluated by using a general metal frame plated by Ag, using a commercially available wire bonder for wedge bonding, and examining the wedge bond. For the bonding conditions, the generally used bonding conditions were used. 50 wedge bonds were examined under an optical microscope. If five or more bonding wires peeled off in a bond, it was judged that there was a problem in practical use and the bondability was indicated as "P" (poor), if three or four wires peeled off, it was judged that there was no problem in practical use and the bondability was indicated as "F" (fair), if one or two wires peeled off, it was judged that the bondability was good and was indicated as "G" (good), while if no failures at all occurred, it was judged that the bondability was particularly good and was indicated as "E" (excellent). The results are shown in Table 2-1 and Table 2-2 in the "Wedge bondability" column.

The feed-out performance of the bonding wire was evaluated by bonding it under general bonding conditions, then examining the loop part of the bonding wire by a scan type microscope and measuring the diameter to find the rate of reduction of diameter of the bonding wire compared with before bonding. If the rate of reduction was 80% or less, the wire was judged as poor. 30 bonding wires were examined. If there were five or more poor wires, it was judged there was a problem in practical use and the performance was indicated as "P" (poor), if three to four poor wires, it was judged there was no problem in practical use and the performance was indicated as "F" (fair), if one to two poor wires, it was judged the performance was good and was indicated as "G" (good), and if no poor wires at all, it was judged the performance was particularly good and was indicated as "E" (excellent). The results are shown in Table 2-1 and Table 2-2 in the "Wire feed-out performance" column.

The service life of the capillary was evaluated by the amount of wear of the hole at the tip of the capillary obtained by examining the hole at the tip of the capillary before and after use. The bonding conditions were made the general conditions. The capillary was examined after bonding wires 3000 times. When wear was confirmed even while not a practical problem, the capillary was judged as "F" (fair), when there was no wear, it was judged as "G" (good), and when there was no wear when examining the capillary after bonding wires 10000 times, it was judged to be excellent and was indicated as "E" (excellent). The results are shown in Table 2-1 and Table 2-2 in the "Capillary service life" column.

TABLE 1-1

| | | Content of component (at %) | | | | | | | | | | | | | | | | | |
|---|---|---|---|---|---|---|---|---|---|---|---|---|---|---|---|---|---|---|---|
| | | First group of alloys | | | | | | | Second group of alloys | | | | Third group of alloys | | | | | | |
| | No. | Be | B | P | Ca | Y | La | Ce | Total | In | Ga | Cd | Total | Ni | Cu | Rh | Pd | Pt | Au | Total |
| Inv. ex. | 1 | 0.031 | | | | | | | 0.031 | 0.05 | | | 0.05 | | | | | | | 0.00 |
| | 2 | | 0.060 | | | | | | 0.060 | 0.10 | | | 0.10 | | | | | | | 0.00 |
| | 3 | | | 0.090 | | | | | 0.090 | 0.50 | | | 0.50 | | | | | | | 0.00 |
| | 4 | | | | 0.120 | | | | 0.120 | 1.00 | | | 1.00 | | | | | | | 0.00 |
| | 5 | | | | | 0.150 | | | 0.150 | 2.00 | | | 2.00 | | | | | | | 0.00 |
| | 6 | | | | | | 0.180 | | 0.180 | 5.00 | | | 5.00 | | | | | | | 0.00 |
| | 7 | | | | | | | 0.031 | 0.031 | | 0.05 | | 0.05 | | | | | | | 0.00 |
| | 8 | 0.060 | | | | | | | 0.060 | | 0.10 | | 0.10 | | | | | | | 0.00 |
| | 9 | | 0.090 | | | | | | 0.090 | | 0.50 | | 0.50 | | | | | | | 0.00 |
| | 10 | | | 0.120 | | | | | 0.120 | | 1.00 | | 1.00 | | | | | | | 0.00 |
| | 11 | | | | 0.150 | | | | 0.150 | | 2.00 | | 2.00 | | | | | | | 0.00 |
| | 12 | | | | | 0.180 | | | 0.180 | | 5.00 | | 5.00 | | | | | | | 0.00 |
| | 13 | | | | | | 0.031 | | 0.031 | | | 0.05 | 0.05 | | | | | | | 0.00 |
| | 14 | | | | | | | 0.060 | 0.060 | | | 0.10 | 0.10 | | | | | | | 0.00 |
| | 15 | 0.090 | | | | | | | 0.090 | | | 0.50 | 0.50 | | | | | | | 0.00 |
| | 16 | | 0.120 | | | | | | 0.120 | | | 1.00 | 1.00 | | | | | | | 0.00 |
| | 17 | | | 0.150 | | | | | 0.150 | | | 2.00 | 2.00 | | | | | | | 0.00 |
| | 18 | | | | 0.180 | | | | 0.180 | | | 5.00 | 5.00 | | | | | | | 0.00 |
| | 19 | | | | | 0.031 | | | 0.031 | 0.03 | 0.03 | | 0.05 | | | | | | | 0.00 |
| | 20 | | | | | | 0.060 | | 0.060 | 0.05 | | 0.05 | 0.10 | | | | | | | 0.00 |
| | 21 | | | | | | | 0.090 | 0.090 | | 0.25 | 0.25 | 0.50 | | | | | | | 0.00 |
| | 22 | 0.120 | | | | | | | 0.120 | 0.50 | 0.50 | | 1.00 | | | | | | | 0.00 |
| | 23 | | 0.150 | | | | | | 0.150 | 1.00 | | 1.00 | 2.00 | | | | | | | 0.00 |
| | 24 | | | 0.180 | | | | | 0.180 | | 2.50 | 2.50 | 5.00 | | | | | | | 0.00 |
| | 25 | | | | 0.031 | | | | 0.031 | 0.05 | 0.05 | 0.05 | 0.15 | | | | | | | 0.00 |
| | 26 | | | | | 0.060 | | | 0.060 | 0.10 | 0.10 | 0.10 | 0.30 | | | | | | | 0.00 |
| | 27 | | | | | | 0.090 | | 0.090 | 0.50 | 0.50 | 0.50 | 1.50 | | | | | | | 0.00 |
| | 28 | | | | | | | 0.120 | 0.120 | 1.00 | 1.00 | 1.00 | 3.00 | | | | | | | 0.00 |
| | 29 | 0.030 | 0.030 | | | | | | 0.060 | 0.10 | | | 0.10 | | | | | | | 0.00 |
| | 30 | | | 0.030 | 0.030 | | | | 0.060 | 1.00 | | | 1.00 | | | | | | | 0.00 |
| | 31 | | | | | 0.030 | 0.030 | 0.030 | 0.090 | 5.00 | | | 5.00 | | | | | | | 0.00 |
| | 32 | | | | 0.045 | 0.045 | | | 0.090 | | 0.10 | | 0.10 | | | | | | | 0.00 |

TABLE 1-2

| | | Content of components (at %) | | | | | | | | | |
|---|---|---|---|---|---|---|---|---|---|---|---|
| | | First group of alloys | | | | | | | | Second group of alloys | |
| | No. | Be | B | P | Ca | Y | La | Ce | Total | In | Ga |
| Inv. ex. | 33 | | | | | | 0.045 | 0.045 | 0.090 | | 1.00 |
| | 34 | 0.045 | 0.045 | 0.045 | | | | | 0.135 | | 5.00 |
| | 35 | | | | | | 0.060 | 0.060 | 0.120 | | |
| | 36 | 0.060 | 0.060 | | | | | | 0.120 | | |
| | 37 | | | 0.060 | 0.060 | 0.060 | | | 0.180 | | |
| | 38 | 0.060 | | | | | | | 0.060 | 0.10 | |
| | 39 | | 0.060 | | | | | | 0.060 | 1.00 | |
| | 40 | | | 0.060 | | | | | 0.060 | 5.00 | |
| | 41 | | | | 0.060 | | | | 0.060 | | 0.10 |
| | 42 | | | | | 0.060 | | | 0.060 | | 1.00 |
| | 43 | | | | | | 0.060 | | 0.060 | | 5.00 |
| | 44 | | | | | | | 0.060 | 0.060 | | |
| | 45 | 0.060 | | | | | | | 0.060 | | |
| | 46 | | 0.060 | | | | | | 0.060 | | |
| Comp. ex. | 101 | | | | | | | | 0.000 | 1.00 | |
| | 102 | | | | | | | | 0.000 | | 1.00 |
| | 103 | | | | | | | | 0.000 | | |
| | 104 | 0.060 | | | | | | | 0.060 | | |
| | 105 | | 0.060 | | | | | | 0.060 | 0.01 | |
| | 106 | | | 0.060 | | | | | 0.060 | | 0.02 |
| | 107 | | | | 0.060 | | | | 0.060 | | |
| | 108 | | | | | 0.060 | | | 0.060 | 6.00 | |
| | 109 | | | | | | 0.060 | | 0.060 | | 6.00 |
| | 110 | | | | | | | 0.060 | 0.060 | | |
| | 111 | 0.010 | | | | | | | 0.010 | 1.00 | |
| | 112 | | 0.020 | | | | | | 0.020 | | 1.00 |
| | 113 | | | 0.030 | | | | | 0.030 | | |
| | 114 | | | | | 0.190 | | | 0.190 | 1.00 | |

TABLE 1-2-continued

| | | | | | |
|---|---|---|---|---|---|
| 115 | | 0.200 | | 0.200 | 1.00 |
| 116 | | | 0.210 | 0.210 | |
| 117 | | | | 0.220 0.220 | 1.00 |

| | | Content of components (at %) | | | | | | | |
|---|---|---|---|---|---|---|---|---|---|
| | | Second group of alloys | | Third group of alloys | | | | | |
| | No. | Cd | Total | Ni | Cu | Rh | Pd | Pt | Au | Total |
| Inv. ex. | 33 | | 1.00 | | | | | | | 0.00 |
| | 34 | | 5.00 | | | | | | | 0.00 |
| | 35 | 0.10 | 0.10 | | | | | | | 0.00 |
| | 36 | 1.00 | 1.00 | | | | | | | 0.00 |
| | 37 | 5.00 | 5.00 | | | | | | | 0.00 |
| | 38 | | 0.10 | 0.01 | | | | | | 0.01 |
| | 39 | | 1.00 | | 0.05 | | | | | 0.05 |
| | 40 | | 5.00 | | | 0.10 | | | | 0.10 |
| | 41 | | 0.10 | | | | 0.50 | | | 0.50 |
| | 42 | | 1.00 | | | | | 1.00 | | 1.00 |
| | 43 | | 5.00 | | | | | | 5.00 | 5.00 |
| | 44 | 0.10 | 0.10 | 0.50 | 0.50 | | | | | 1.00 |
| | 45 | 1.00 | 1.00 | | | 0.50 | 0.50 | | | 1.00 |
| | 46 | 5.00 | 5.00 | | | | | 0.50 | 0.50 | 1.00 |
| Comp. ex. | 101 | | 1.00 | | | | | | | 0.00 |
| | 102 | | 1.00 | | | | | | | 0.00 |
| | 103 | 1.00 | 1.00 | | | | | | | 0.00 |
| | 104 | | 0.00 | | | | | | | 0.00 |
| | 105 | | 0.01 | | | | | | | 0.00 |
| | 106 | | 0.02 | | | | | | | 0.00 |
| | 107 | 0.04 | 0.04 | | | | | | | 0.00 |
| | 108 | | 6.00 | | | | | | | 0.00 |
| | 109 | | 6.00 | | | | | | | 0.00 |
| | 110 | 6.00 | 6.00 | | | | | | | 0.00 |
| | 111 | | 1.00 | | | | | | | 0.00 |
| | 112 | | 1.00 | | | | | | | 0.00 |
| | 113 | 1.00 | 1.00 | | | | | | | 0.00 |
| | 114 | | 1.00 | | | | | | | 0.00 |
| | 115 | | 1.00 | | | | | | | 0.00 |
| | 116 | 1.00 | 1.00 | | | | | | | 0.00 |
| | 117 | | 1.00 | | | | | | | 0.00 |

TABLE 2-1

| | | Wire evaluation | | | | | | |
|---|---|---|---|---|---|---|---|---|
| | | Average | | | | Result of evaluation of quality | | |
| | No. | Surface layer composition ratio 1 | Average crystal grain size (μm) | <100> abundance ratio (%) | Surface layer composition ratio 2 | Intermetallic compound layer formability | Low loop characteristic | Leaning characteristic |
| Inv. ex. | 1 | 2.2 | 0.5 | 45 | 1.6 | G | G | G |
| | 2 | 2.0 | 3.2 | 56 | 1.4 | E | E | E |
| | 3 | 1.8 | 1.1 | 54 | 1.4 | E | E | E |
| | 4 | 2.1 | 2.1 | 26 | 1.5 | E | E | E |
| | 5 | 2.2 | 0.4 | 78 | 1.2 | E | E | E |
| | 6 | 2.2 | 3.8 | 100 | 1.2 | E | E | E |
| | 7 | 2.0 | 3.5 | 30 | 1.1 | G | G | G |
| | 8 | 2.0 | 0.8 | 35 | 1.2 | E | E | E |
| | 9 | 1.6 | 0.2 | 67 | 1.3 | E | E | E |
| | 10 | 2.2 | 3.3 | 54 | 1.4 | E | E | E |
| | 11 | 3.8 | 2.2 | 89 | 3.5 | E | E | E |
| | 12 | 2.4 | 2.4 | 87 | 1.5 | E | E | E |
| | 13 | 2.1 | 0.3 | 28 | 1.2 | G | G | G |
| | 14 | 2.2 | 0.1 | 32 | 1.7 | E | E | E |
| | 15 | 1.9 | 1.1 | 98 | 1.4 | E | E | E |
| | 16 | 2.5 | 1.5 | 65 | 1.2 | E | E | E |
| | 17 | 2.2 | 2.4 | 54 | 2.0 | E | E | E |
| | 18 | 2.2 | 2.8 | 50 | 1.5 | E | E | E |
| | 19 | 2.3 | 3.3 | 32 | 1.4 | G | G | G |
| | 20 | 2.2 | 0.8 | 65 | 1.0 | E | E | E |
| | 21 | 1.5 | 1.8 | 90 | 1.2 | E | E | E |
| | 22 | 2.0 | 2.7 | 78 | 1.3 | E | E | E |
| | 23 | 2.0 | 3.6 | 73 | 1.5 | E | E | E |
| | 24 | 2.1 | 0.6 | 54 | 1.5 | E | E | E |

TABLE 2-1-continued

| | | | | | | | |
|---|---|---|---|---|---|---|---|
| 25 | 1.5 | 0.9 | 62 | 1.6 | G | G | G |
| 26 | 4.0 | 1.7 | 43 | 4.0 | E | E | E |
| 27 | 2.5 | 2.4 | 22 | 1.4 | E | E | E |
| 28 | 2.3 | 2.9 | 78 | 1.4 | E | E | E |
| 29 | 2.1 | 2.1 | 46 | 1.3 | E | E | E |
| 30 | 2.2 | 3.5 | 79 | 1.5 | E | E | E |
| 31 | 2.2 | 1.4 | 26 | 1.2 | E | E | E |
| 32 | 2.0 | 3.2 | 31 | 1.9 | E | E | E |

| | | Result of evaluation of quality | | | | | |
|---|---|---|---|---|---|---|---|
| | No. | FAB shape | HAST | Chip damage | Service life | Wedge bondability | Wire feed-out performance | Capillary service life |
| Inv. ex. | 1 | G | F | G | G | E | E | E |
| | 2 | E | G | G | G | E | E | E |
| | 3 | E | E | G | G | G | E | E |
| | 4 | E | E | G | G | G | E | E |
| | 5 | E | G | G | G | E | E | E |
| | 6 | G | F | G | G | E | G | E |
| | 7 | G | F | G | G | E | E | G |
| | 8 | E | G | G | G | E | E | E |
| | 9 | E | E | G | G | G | E | E |
| | 10 | E | E | G | G | E | E | E |
| | 11 | E | G | G | G | E | E | E |
| | 12 | G | F | G | G | E | E | E |
| | 13 | G | F | G | G | G | E | E |
| | 14 | E | G | G | G | E | G | E |
| | 15 | E | E | G | G | G | E | E |
| | 16 | E | E | G | G | E | E | E |
| | 17 | E | G | G | G | E | E | E |
| | 18 | G | F | G | G | E | E | E |
| | 19 | G | F | G | G | E | E | E |
| | 20 | E | G | G | G | E | E | F |
| | 21 | E | E | G | G | G | E | E |
| | 22 | E | E | G | G | E | E | E |
| | 23 | E | G | G | G | E | G | E |
| | 24 | G | F | G | G | E | E | E |
| | 25 | G | G | G | G | G | E | E |
| | 26 | E | G | G | G | E | E | E |
| | 27 | E | E | G | G | G | E | E |
| | 28 | E | G | G | G | E | E | E |
| | 29 | E | G | G | G | E | E | E |
| | 30 | E | E | G | G | E | E | E |
| | 31 | E | F | G | G | G | E | E |
| | 32 | E | G | G | G | E | E | E |

Surface layer composition ratio 1: $X_{0\text{-}10\ nm}/X_{20\text{-}30\ nm}$
Surface layer composition ratio 2: $X_{0\text{-}1\ nm}/X_{1\text{-}10\ nm}$
Crystal direction ratio: Ratio of <100> direction in longitudinal direction cross-section (%)

TABLE 2-2

| | | Wire evaluation | | | | Result of evaluation of quality | | |
|---|---|---|---|---|---|---|---|---|
| | No. | Surface layer composition ratio 1 | Average crystal grain size (μm) | Crystal direction ratio (%) | Surface layer composition ratio 2 | Intermetallic compound layer formability | Low loop characteristic | Leaning characteristic |
| Inv. ex. | 33 | 1.8 | 0.2 | 55 | 1.6 | E | E | E |
| | 34 | 2.1 | 0.1 | 61 | 1.3 | E | E | E |
| | 35 | 2.1 | 3.4 | 43 | 1.4 | E | E | E |
| | 36 | 2.4 | 1.5 | 78 | 1.1 | E | E | E |
| | 37 | 2.3 | 0.5 | 70 | 1.3 | E | E | E |
| | 38 | 2.0 | 0.2 | 71 | 1.2 | E | E | E |
| | 39 | 2.4 | 0.8 | 58 | 1.4 | E | E | E |
| | 40 | 2.4 | 1.7 | 52 | 1.4 | E | E | E |
| | 41 | 2.0 | 2.7 | 54 | 1.3 | E | E | E |
| | 42 | 2.0 | 2.1 | 65 | 1.5 | E | E | E |
| | 43 | 2.4 | 3.2 | 34 | 1.4 | E | E | E |
| | 44 | 2.1 | 3.4 | 60 | 1.4 | E | E | E |
| | 45 | 2.1 | 1.4 | 78 | 1.3 | E | E | E |
| | 46 | 2.2 | 2.4 | 98 | 1.4 | E | E | E |

TABLE 2-2-continued

| | No. | | | | | | | |
|---|---|---|---|---|---|---|---|---|
| Comp. ex. | 101 | 1.5 | 0.2 | 55 | 1.1 | F | F | F |
| | 102 | 2.0 | 3.4 | 22 | 1.5 | F | F | F |
| | 103 | 2.1 | 1.5 | 60 | 1.2 | F | F | F |
| | 104 | — | 3.8 | 42 | — | E | E | E |
| | 105 | 1.1 | 3.9 | 77 | 1.0 | E | E | E |
| | 106 | 1.2 | 3.7 | 71 | 1.1 | E | E | E |
| | 107 | 1.3 | 4.0 | 59 | 1.1 | E | E | E |
| | 108 | 3.4 | 0.1 | 51 | 1.3 | E | E | E |
| | 109 | 3.0 | 0.1 | 51 | 1.4 | E | E | E |
| | 110 | 2.8 | 0.1 | 66 | 1.4 | E | E | E |
| | 111 | 3.2 | 0.5 | 25 | 1.5 | F | F | F |
| | 112 | 1.7 | 2.7 | 33 | 1.1 | F | F | F |
| | 113 | 2.5 | 2.1 | 59 | 1.4 | F | F | F |
| | 114 | 2.4 | 0.1 | 77 | 1.3 | F | F | F |
| | 115 | 1.4 | 3.2 | 99 | 1.1 | F | F | F |
| | 116 | 2.0 | 2.4 | 27 | 1.6 | F | F | F |
| | 117 | 2.6 | 3.6 | 65 | 1.4 | F | F | F |

| | | | Result of evaluation of quality | | | | | |
|---|---|---|---|---|---|---|---|---|
| | | No. | FAB shape | HAST | Chip damage | Senice life | Wedge bondability | Wire feed-out performance | Capillary service life |
| Inv. ex. | | 33 | E | E | G | G | G | E | E |
| | | 34 | E | F | G | G | E | G | G |
| | | 35 | E | G | G | G | E | E | E |
| | | 36 | E | E | G | G | E | E | G |
| | | 37 | G | F | G | G | E | E | E |
| | | 38 | E | G | G | E | E | E | E |
| | | 39 | E | E | G | E | E | E | E |
| | | 40 | E | F | G | E | E | E | E |
| | | 41 | E | G | G | E | E | E | E |
| | | 42 | E | E | G | E | E | E | E |
| | | 43 | E | F | G | E | E | E | E |
| | | 44 | E | G | G | E | E | E | E |
| | | 45 | E | E | G | E | E | E | E |
| | | 46 | E | F | G | E | E | E | E |
| Comp. ex. | | 101 | F | E | G | G | G | E | G |
| | | 102 | F | E | G | G | G | E | E |
| | | 103 | F | E | G | G | E | E | E |
| | | 104 | E | P | G | G | G | G | F |
| | | 105 | E | P | G | G | G | F | F |
| | | 106 | E | P | G | G | G | G | G |
| | | 107 | E | P | G | G | G | F | G |
| | | 108 | E | G | P | G | E | G | G |
| | | 109 | E | G | P | G | E | G | G |
| | | 110 | E | G | P | G | E | G | G |
| | | 111 | F | E | G | G | G | E | E |
| | | 112 | F | E | G | G | G | E | G |
| | | 113 | F | E | G | G | E | G | E |
| | | 114 | P | E | G | G | E | E | G |
| | | 115 | P | E | G | G | G | E | G |
| | | 116 | P | E | G | G | G | E | E |
| | | 117 | P | E | G | G | E | G | E |

Surface layer composition ratio 1: $X_{0\text{-}10\,nm}/X_{20\text{-}30\,nm}$
Surface layer composition ratio 2: $X_{0\text{-}1\,nm}/X_{1\text{-}10\,nm}$
Crystal direction ratio: Ratio of <100> direction in longitudinal direction cross-section (%)

Invention Example Nos. 1 to 46 of Table 1-1, Table 1-2, Table 2-1, and Table 2-2 are examples of the present invention. The Invention Example Nos. 1 to 46 could give good results in all quality indicators.

Comparative Example Nos. 101 to 117 of Table 1-2 and Table 2-2 are comparative examples. Further, the blank fields in the evaluations in the comparative examples indicate no evaluations were performed. Comparative Example Nos. 101 to 103 did not include any of the first group of elements, Comparative Example Nos. 111 to 113 had contents of the first group of elements outside the lower limits of the present invention, while Comparative Example Nos. 114 to 117 had contents of the first group of elements outside the upper limits of the present invention. In all cases, the intermetallic compound layer formability, low loop characteristic, leaning characteristic, and FAB shape were poor.

Comparative Example Nos. 104 to 107 had contents of the second group of elements outside the lower limits of the present invention and were poor in HAST results. Comparative Example Nos. 108 to 110 had contents of the second group of elements outside the upper limits of the present invention and had bad chip damage.

INDUSTRIAL APPLICABILITY

The present invention can be utilized for a semiconductor device. That is, the bonding wire according to the present invention can be utilized for connecting an electrode on a semiconductor chip with an external lead or other interconnect of a circuit board.

The invention claimed is:

1. Bonding wire for semiconductor devices consisting of:
    (C-1) P of 0.060 at % to 0.180 at %, or (C-2) P and one or more of Be, B, Ca, Y, La, and Ce in a total of 0.060 at % to 0.180 at %;
    one or more of In, Ga, and Cd in a total of 0.05 at % to 5.00 at %;
    one or more of Ni, Cu, Rh, Pd, Pt, and Au in a total of 0.01 at % to 5.00 at %; and
    a balance of Ag and unavoidable impurities.

2. The bonding wire for semiconductor devices according to claim 1 wherein when defining a ratio of a total of a number of atoms of In, Ga, and Cd with respect to a total number of atoms of metal elements as a second element atomic ratio, the second element atomic ratio at a region from a wire surface to 1 nm from the wire surface in a depth direction is 1.1 times or more the second element atomic ratio at a region from 1 nm from the wire surface to 10 nm from the wire surface in the depth direction.

3. The bonding wire for semiconductor devices according to claim 1 wherein when defining a ratio of the total of a number of atoms of In, Ga, and Cd with respect to a total number of atoms of metal elements as a second element atomic ratio, the second element atomic ratio at a region from a wire surface to 10 nm from the wire surface in a depth direction is 2 times or more the second element atomic ratio at a region from 20 nm from the wire surface to 30 nm from the wire surface in the depth direction.

4. The bonding wire for semiconductor devices according to claim 1 wherein an average crystal grain size in a cross-section perpendicular to a wire axis is 0.2 μm to 3.5 μm.

5. The bonding wire for semiconductor devices according to claim 1, wherein when measuring a crystal direction in a wire axial direction at a cross-section parallel to a wire axis, including the wire axis, of said bonding wire, the abundance ratio of a <100> crystal direction where an angular difference with respect to the wire axial direction of said bonding wire is 15 degrees or less is, by area ratio, 30% to 100%.

6. The bonding wire for semiconductor devices according to claim 1 containing one or more of In, Ga, and Cd in a total of 2.00 at % or less.

7. Bonding wire for semiconductor devices consisting of:
    (C-3) P of 0.031 at % to less than 0.060 at % or (C-4) P of 0.031 at % to less than 0.060 at % and one or more of Be, B, Ca, Y, La, and Ce in a total of 0.031 at % to 0.180 at %;
    one or more of In, Ga, and Cd in a total of 0.05 at % to 5.00 at %;
    one or more of Ni, Cu, Rh, Pd, Pt, and Au in a total of 0.01 at % to 5.00 at %; and
    a balance of Ag and unavoidable impurities,
    wherein when defining a ratio of the total of a number of atoms of In, Ga, and Cd with respect to a total number of atoms of metal elements as a second element atomic ratio, the bonding wire satisfies one or both of
    (A) the second element atomic ratio at a region from a wire surface to 1 nm from the wire surface in a depth direction is 1.1 times or more the second element atomic ratio at a region from 1 nm from the wire surface to 10 nm from the wire surface in the depth direction, and
    (B) the second element atomic ratio at a region from the wire surface to 10 nm from the wire surface in the depth direction is 2 times or more the second element atomic ratio at a region from 20 nm from the wire surface to 30 nm from the wire surface in the depth direction.

* * * * *